(12) United States Patent
Yano et al.

(10) Patent No.: US 7,729,169 B2
(45) Date of Patent: Jun. 1, 2010

(54) MULTIPLE PROGRAMMING OF SPARE MEMORY REGION FOR NONVOLATILE MEMORY

(75) Inventors: Masaru Yano, Tokyo (JP); Akira Ogawa, Tokyo (JP)

(73) Assignee: Spansion LLC, Sunnyvale, CA (US)

(*) Notice: Subject to any disclaimer, the term of this patent is extended or adjusted under 35 U.S.C. 154(b) by 165 days.

(21) Appl. No.: 12/126,686

(22) Filed: May 23, 2008

(65) Prior Publication Data

US 2009/0129147 A1 May 21, 2009

(30) Foreign Application Priority Data

May 23, 2007 (JP) .............................. 2007-136396

(51) Int. Cl.
*G11C 11/34* (2006.01)
*G11C 16/04* (2006.01)
*G11C 16/06* (2006.01)

(52) U.S. Cl. ............................ 365/185.09; 365/185.11; 365/185.2

(58) Field of Classification Search ............ 365/185.09, 365/185.11, 185.2
See application file for complete search history.

(56) References Cited

FOREIGN PATENT DOCUMENTS

JP 2004087047 3/2004

*Primary Examiner*—Ly D Pham

(57) ABSTRACT

Structures, methods, and systems for multiple programming of spare memory region for nonvolatile memory are disclosed. In one embodiment, a nonvolatile memory system comprises a main memory cell array, a spare memory cell array, and a memory controller that divides the spare memory cell array into at least a first region and a second region. The system further comprises a selection module for selecting the main memory cell array and the first region to write data and the first reference cell to write first reference data associated with the data during an initial data writing operation and for selecting the second region to write additional data and the second reference cell to write second reference data associated with the additional data during an additional data writing operation.

20 Claims, 5 Drawing Sheets

MULTIPLE PROGRAMMING OF SPARE MEMORY REGION FOR NONVOLATILE MEMORY

CLAIM OF PRIORITY

This application claims priority from Japanese patent application 2007-136396 filed on May 23, 2007.

FIELD OF TECHNOLOGY

The present invention relates to nonvolatile memory, and particularly to devices, systems and methods for writing data to the non-volatile memory.

BACKGROUND

A flash memory has multiple memory cell arrays and reference cells. Writing of data in a memory cell array is accompanied by writing of reference data in a reference cell that is associated with the memory cell array. When the data is read, the current from the memory cell array and the current from the reference cell are compared. In between the writing operation and the reading operation, the loss of electric charge may occur in the memory cell array and in the reference cell with the lapse of time. As the data reading requires the balanced amount of charge loss between the memory cell and the reference cell, the writing operation should be done concurrently for the memory cell array and the reference cell.

Thus, once data is written to at least a part of the memory cell array, no other reference cell is available for writing another reference data therein as additional data is written to the memory cell array thereafter. That is the reason why additional data writing is often prohibited in the memory cell array. In order to enable the additional data writing operation in the flash memory, a refreshing circuit may be needed. However, the introduction of the refreshing circuit to the flash memory may bring a significant change to the architecture of the memory, and lead to an increase in the size of the flash memory.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

An embodiment described in the detailed description is directed to a nonvolatile memory device which comprises a main memory cell array, a spare memory cell array divided into a first region and a second region, a first reference cell associated with the main memory and the first region of the spare memory cell, and a second reference cell associated with the second region of the spare memory cell. The nonvolatile device further comprises a selection module for selecting the main memory cell array and the first region to write data and the first reference cell to write first reference data associated with the data during an initial data writing operation and for selecting the second region to write additional data and the second reference cell to write second reference data associated with the additional data during an additional data writing operation.

As illustrated in the detailed description, other embodiments pertain to structures, methods, and systems that enable additional writing of data in the nonvolatile memory. By dividing the spare memory cell array into two or more regions and implementing the number of reference cells in step with the number of the regions, one or more additional data writing to the spare memory cell array is made possible. This is more efficient than implementing a refresher circuit since the refresher circuit often requires more space from the memory device, and complicates the circuit design of the nonvolatile memory.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations for fabricating semiconductor devices. These descriptions and representations are the means used by those skilled in the art of semiconductor device fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Unless specifically stated otherwise as apparent from the following discussions, is appreciated that throughout the present application, discussions utilizing terms such as "forming," "performing," "producing," "depositing," or "etching," or the like, refer to actions and processes of semiconductor device fabrication.

Briefly stated, embodiments pertain to structures, methods, and systems that enable additional writing of data in the nonvolatile memory. By dividing the spare memory cell array of the nonvolatile memory into two or more regions and implementing the number of reference cells in step with the number of the regions, one or more additional data writing to the spare memory cell array is made possible. This is more efficient than implementing a refresher circuit since the refresher circuit often require more space from the memory device, and complicates the circuit architecture of the nonvolatile memory.

Figure 1:
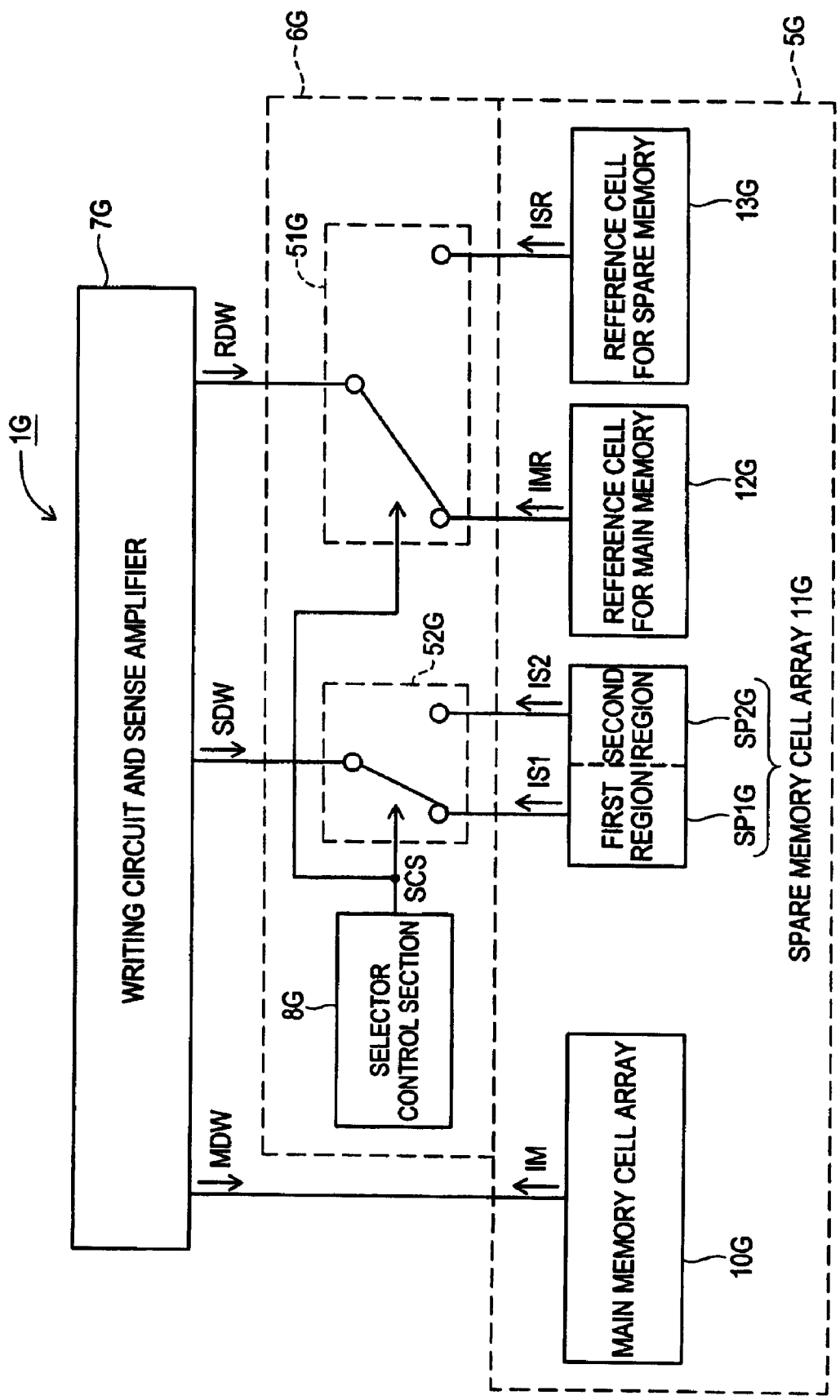
FIG. 1 is a block diagram of an exemplary system diagram which enables the second programming of spare memory region in a non-volatile memory, according to one embodiment.

FIG. 1 is a block diagram of an exemplary system diagram which enables the second programming of spare memory region in a non-volatile memory, according to one embodiment. A nonvolatile memory system 1G comprises a memory cell array 5G, selection module 6G, a writing circuit and a sense amplifier 7G. When writing data, the writing circuit and the sense amplifier 7G output data for main memory MDW, data for spare memory SDW and reference data RDW.

The memory cell array 5G comprises a main memory cell array 10G, a spare memory cell array 11G, a reference cell for main memory 12G and a reference cell for spare memory 13G. The spare memory cell array 11G is divided into a first region SP1G and a second region SP2G. The division can be done freely by the user. The main memory cell array 10G receives the data for main memory MDW from the writing circuit and sense amplifier 7G when data is written, and outputs a main memory cell current IM when data is read. The first region SP1G receives the data for spare memory SDW from the writing circuit and sense amplifier 7G when data is written, and outputs a first memory cell current IS1 when data is read. The second region SP2G receives the data for spare memory SDW when data is written, and outputs second memory cell current IS2 when data is read. The reference cell for main memory 12G receives the reference data RDW from the writing circuit and sense amplifier 7G when data is written, and outputs a main memory reference cell current IMR when data is read. The reference cell for spare memory 13G receives the reference data RDW from the writing circuit and sense amplifier 7G when data is written, and outputs a spare memory reference cell current ISR when data is read.

The selection module 6G comprises a selector control section 8G, a first selector 51G, and a second selector 52G. The first selector 51G switches the cell, to which the writing circuit and the sense amplifier 7G are connected, between the reference cell for main memory 12G and the reference cell for spare memory 13G, in accordance with a selector switching signal SCS which is forwarded from the selector control section 8G. The second selector 52G switches the region, to which the writing circuit and the sense amplifier 7G are connected, between the first region SP1G and the second region SP2G, in accordance with the selector switching signal SCS.

The loss of electric charge may occur in the memory cell and the reference cell with the lapse of time after the writing operation. Correct data reading from the memory may require the balanced amount of charge loss between the memory cell and the reference cell. That is, the writing operation should be done concurrently to the memory cell and to the reference cell.

During the initial data writing operation, the selection module 6G selects the first region SP1G as the destination of writing the data for spare memory SDW, and selects the reference cell for main memory 12G as the destination of writing the reference data RDW. As a result, during the initial data writing operation, writing of data for main memory MDW in the main memory cell array 10G and writing of data for spare memory SDW in the first region SP1G are carried out at the same time. At the same time as these writing operations are done, the reference data RDW is written in the reference cell for main memory 12G.

During additional data writing operation, the selection module 6G selects the second region SP2G as the destination of writing the data for spare memory SDW, and selects the reference cell for spare memory 13G as the destination of writing the reference data RDW. As a result, during the additional data writing operation, at the same time as the data for spare memory SDW is written in the second region SP2G, the reference data RDW is written in the reference cell for spare memory 13G.

When data is read from the main memory cell array 10G and from the first region SP1G, the selection module 6G selects the reference cell for main memory 12G. Then the main memory cell current IM and the reference cell current for main memory IMR are compared, and the first memory cell current IS1 and the reference cell current for main memory IMR are compared. Since the initial data writing operation was done in all of these cells at the same time, influence of the charge loss can be eliminated or minimized from the output currents, thus enabling the system 1G to read the data correctly.

To read data from the second region SP2G, the selection module 6G selects the reference cell for spare memory 13G. Then the second memory cell current IS2 and the reference cell current for spare memory ISR are compared. Since the initial data writing operation was done in all of these cells at the same time, influence of the charge loss can be eliminated or minimized from the output currents, thus enabling the system 1G to read the data correctly.

Thus such a relationship based on the timing of writing operation can be established, as the reference cell for main memory 12G is associated to the initial data writing operation, and the reference cell for spare memory 13G is associated to the additional data writing operation. As a result, since the second region SP2G and the reference cell for spare memory 13G can be used in an additional programming operation to add data, additional data can be written in the second region SP2G. In other words, additional data writing operation can be made once to the spare memory cell array 11G.

In order to enable overwriting to the spare memory cell array 11G, the selection module 6G may be provided. Since this eliminates the need for a refreshing circuit or the like having a large circuit size, a significant change in the circuit design is not necessary and additional data writing operation to the spare memory cell array 11G is enabled while avoiding an increase in the circuit size.

Figure 2:
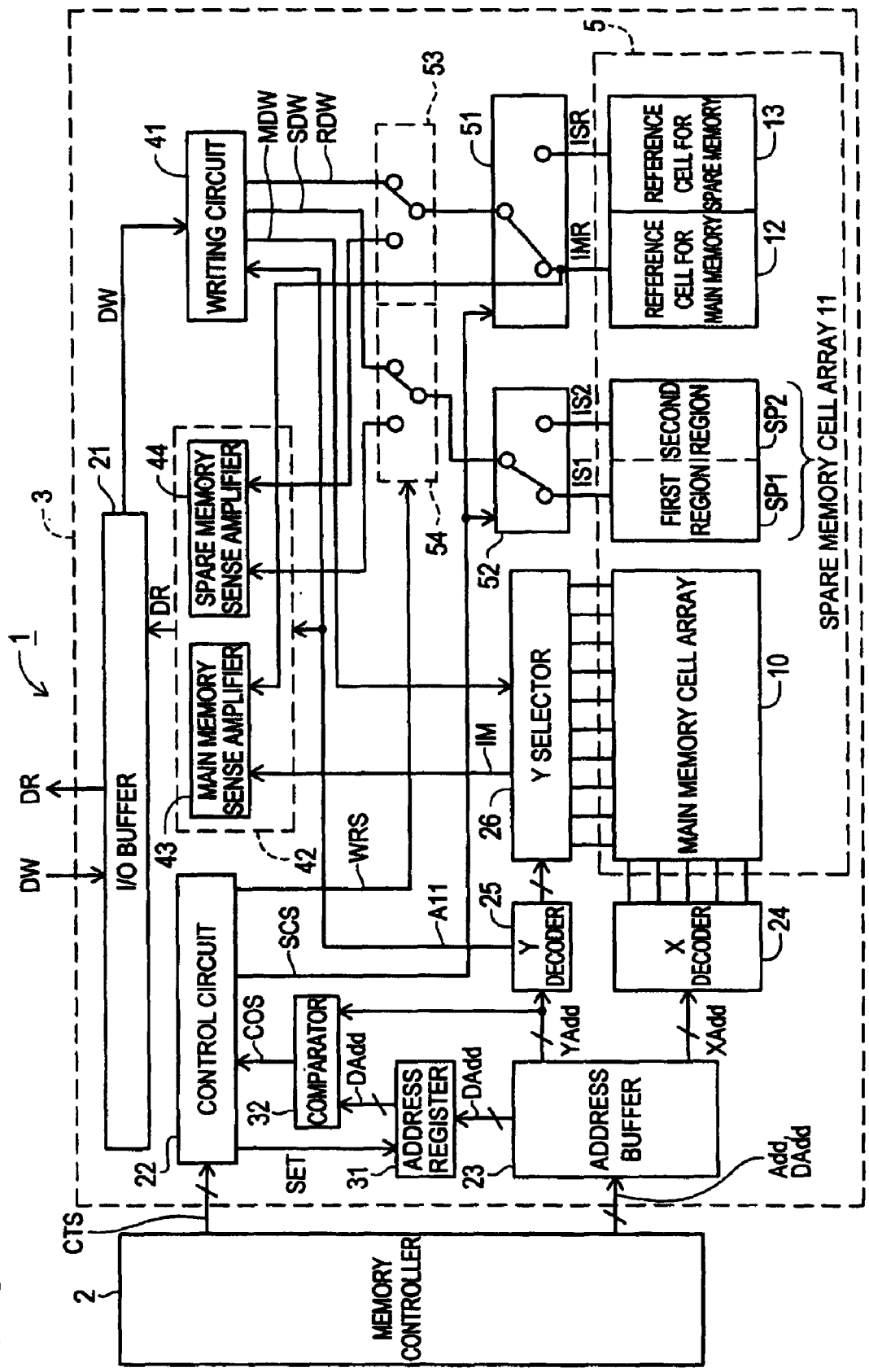
FIG. 2 is a schematic diagram of an exemplary system diagram which enables the second programming of spare memory region in a non-volatile memory, according to one embodiment.

Embodiments of the present invention will now be described with reference to FIGS. 2 to 5. FIG. 2 shows the overall constitution of the nonvolatile memory system 1 of the present invention. The nonvolatile memory system 1 comprises a memory controller 2 and a memory 3. The memory 3 comprises a memory cell array 5, an I/O buffer 21, a control circuit 22, an address buffer 23, an X decoder 24, a Y decoder 25, a Y selector 26, a first selector 51, a second selector 52, a third selector 53, a fourth selector 54, a writing circuit 41 and a sense amplifier 42.

The memory cell array 5 has nonvolatile memory cells having control gates and floating gates arranged in an array. The plurality of memory cells are connected to a plurality of word lines and a plurality of bit lines. The memory cell array 5 is divided into four regions consisting of a main memory cell array 10, a spare memory cell array 11, a reference cell for main memory 12, and a reference cell for spare memory 13, and all of these cells are connected with common word lines. The reference cell for main memory 12 is provided in correspondence to the main memory cell array 10, and the reference cell for spare memory 13 is provided in correspondence to the spare memory cell array 11. The spare memory cell array 11 is further divided into the first region SP1 and the second region SP2. This division may be freely determined by the end user, as will be described later. The reference cell for main memory 12 and the reference cell for spare memory 13 are dynamic reference cells, and are used to write the reference data RDW therein.

The I/O buffer 21 receives write data DW to be written in the memory cell array 5, and outputs read data DR which is read from the memory cell array 5. The address buffer 23 receives an address signal Add from the memory controller 2. A row address XAdd from the address buffer 23 is forwarded to an X decoder 24. The X decoder 24 is connected to a plurality of word lines. A column address YAdd from the address buffer 23 is forwarded to a Y decoder 25. The Y decoder 25 is connected to the plurality of bit lines of the main memory cell array 10 and of the spare memory cell array 11, and is also connected to the bit lines of the reference cell for main memory 12 and the reference cell for spare memory 13 via the Y selector 26. The Y decoder 25 forwards the address A11.

An address register 31 holds a division address DAdd. The division address DAdd is the address of the border that divides the spare memory cell array 11 into the first region SP1 and the second region SP2. When the column address YAdd is lower than the division address DAdd, the first region SP1 or the main memory cell array 10 is assumed as the destination of access. When the column address YAdd is higher than the division address DAdd, the second region SP2, the reference cell for main memory 12 or the reference cell for spare memory 13 is assumed as the destination of access. A comparator 32 receives the division address DAdd and the column address YAdd, and outputs a comparison signal COS. The control circuit 22 receives a control signal CTS and the comparison signal COS, and outputs a switching signal WRS and a selector switching signal SCS. The control circuit 22 controls writing, verification and reading of the memory cell array 5. The sense amplifier 42 comprises a main memory sense amplifier 43 and a spare memory sense amplifier 44. The writing circuit 41 receives the write data DW from the I/O buffer 21 and the address A11 from the Y decoder 25. The writing circuit 41 outputs data for main memory MDW, data for spare memory SDW and reference data RDW.

The first selector 51 switches the cell, to which the third selector 53 is to be connected, between the reference cell for main memory 12 and the reference cell for spare memory 13, in accordance with the selector switching signal SCS. The second selector 52 switches the region, to which the fourth selector 54 is to be connected, between the first region SP1 and the second region SP2 of the spare memory cell array 11, in accordance with the selector switching signal SCS. The third selector 53 switches the circuit, to which the first selector 51 is to be connected, between the writing circuit 41 and the spare memory sense amplifier 44, in accordance with the switching signal WRS. The fourth selector 54 switches the circuit, to which the second selector 52 is to be connected, between the writing circuit 41 and the spare memory sense amplifier 44, in accordance with the switching signal WRS.

When writing data, the data for main memory MDW is input to the main memory cell array 10, the data for spare memory SDW is input to the first region SP1 and/or the second region SP2, and the reference data RDW is input to the reference cell for main memory 12 and/or the reference cell for spare memory 13. When reading data, a main memory cell current IM which is output from the main memory cell array 10 is input to the main memory sense amplifier 43 via the Y selector 26. Also, either a first memory cell current IS1 which is output from the first region SP1 or a second memory cell current IS2 which is output from the second region SP2 is input to the spare memory sense amplifier 44 via the second selector 52 and the fourth selector 54. Further, either a reference cell current for main memory IMR which is output from the reference cell for main memory 12 or a reference cell current for spare memory ISR which is output from the reference cell for spare memory 13 is input to the spare memory sense amplifier 44 via the first selector 51 and the third selector 53.

Figure 3:
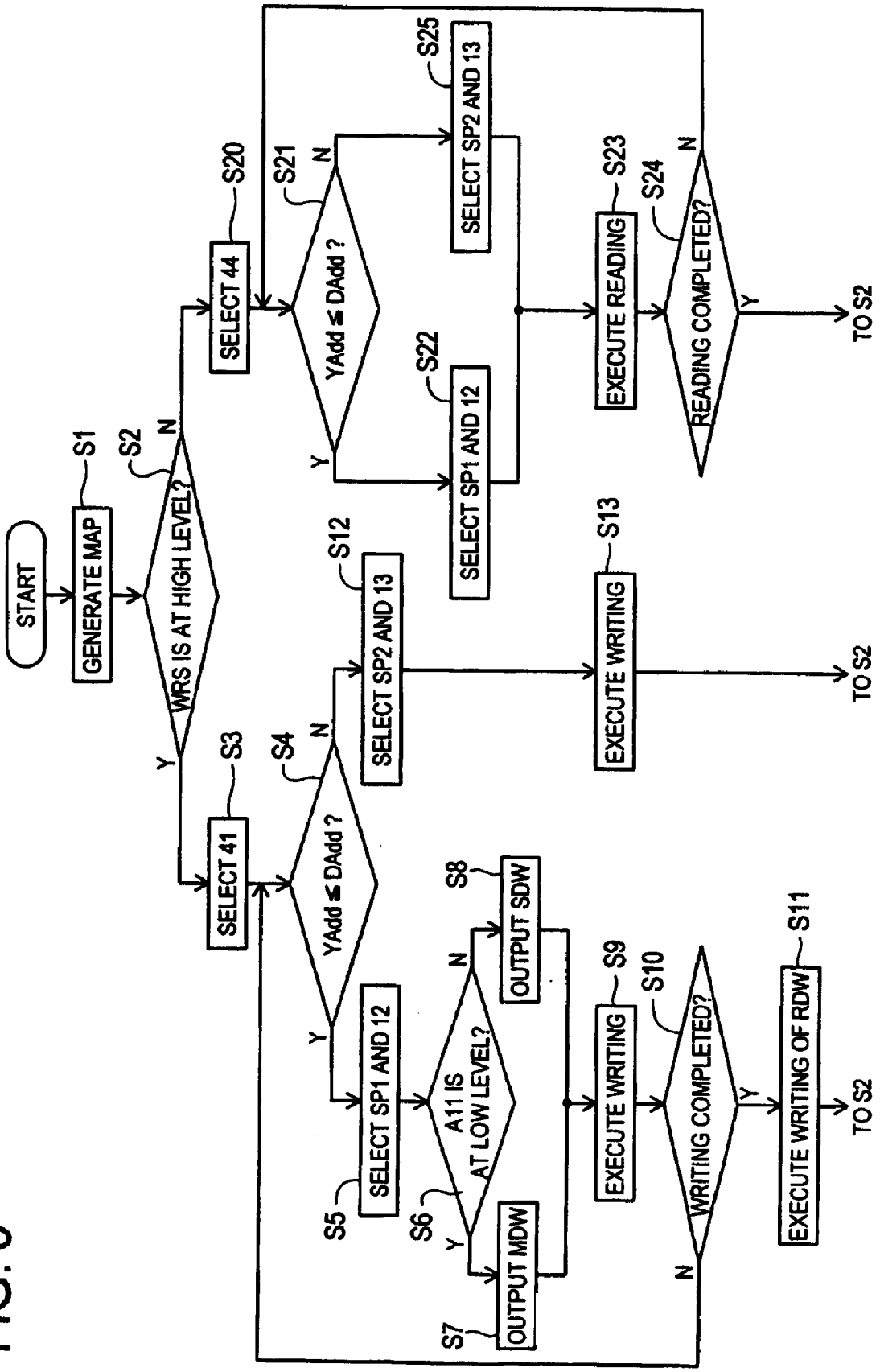
FIG. 3 is a flow chart of an exemplary method for multiple programming of spare memory region in a non-volatile memory and reading from the memory, according to one embodiment.
Figure 4:
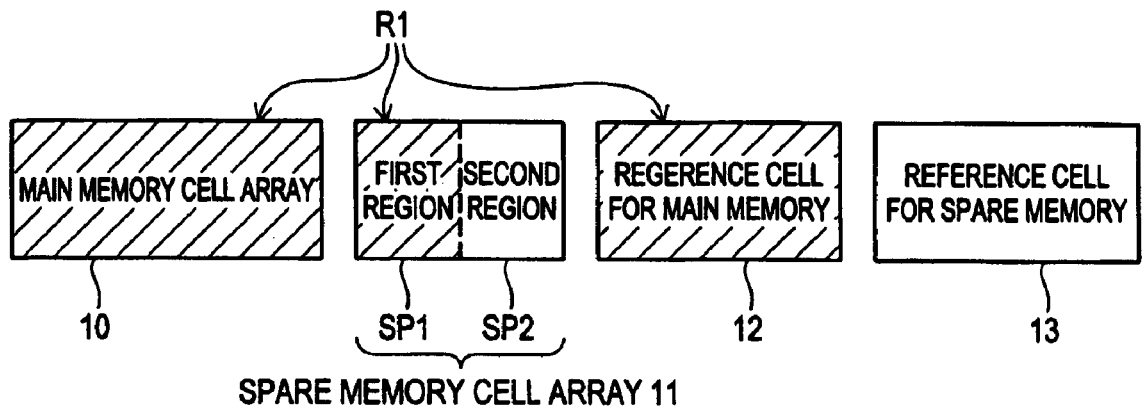
FIG. 4 is a block diagram of the parts of the exemplary nonvolatile memory in FIG. 1 through FIG. 3 which are filled after the initial data writing operation, according to one embodiment.
Figure 5:
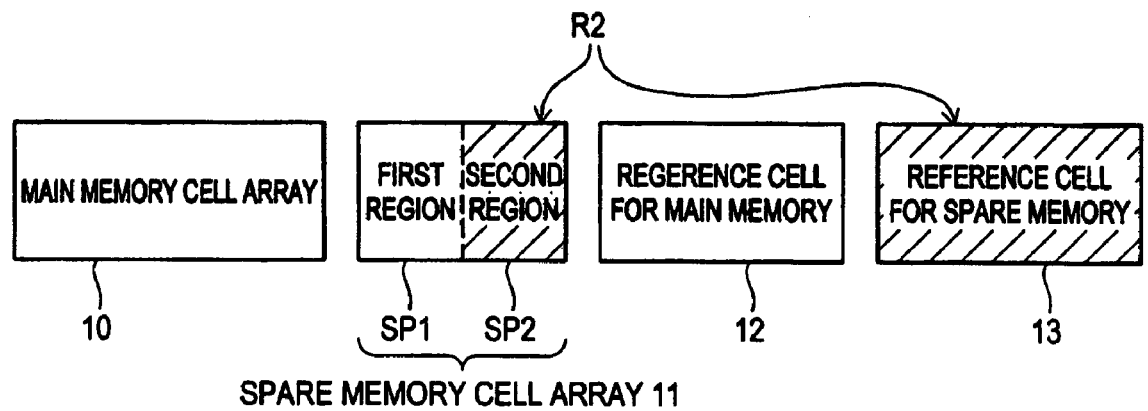
FIG. 5 is a block diagram of the parts of the exemplary nonvolatile memory in FIG. 1 through FIG. 3 which are filled after the additional data writing operation, according to one embodiment.

The operation of the nonvolatile memory system 1 in FIG. 2 is now described with reference to the flow chart of FIG. 3. First in step S1, a map is generated as initial setting. When generating the map, the user determines the division address DAdd for dividing the spare memory cell array 11 in accordance with the use of the memory 3. The division may be done in the unit of two bytes. In case the spare memory cell array 11 has a capacity of 16 bytes, for example, the division address DAdd may be determined so as to divide the array into 8 bytes of the first region SP1 and 8 bytes of the second region SP2.

Then the memory controller 2 forwards the control signal CTS to the control circuit 22 indicating that the division address DAdd is to be set in the memory 3. At the same time, the division address DAdd is input to the address buffer 23. The control circuit 22 uses the set signal SET to set the division address DAdd which is input to the address buffer 23 in the address register 31. This causes the division address DAdd to be set in the memory 3 via the memory controller 2, so that the spare memory cell array 11 is divided into the first region SP1 and the second region SP2, thus completing the mapping.

Then in step S2, it is decided whether the operation is writing mode or reading mode. The mode is determined according to the switching signal WRS which is output from the control circuit 22. When the memory 3 is set in writing mode, the memory controller 2 inputs the control signal CTS to the control circuit 22 indicating that data is to be written in it, so as to output high-level switching signal WRS (step S2: Y). When the memory 3 is set in reading mode, the memory controller 2 inputs the control signal CTS to the control circuit 22 indicating that data is to be read from it, so as to output low-level switching signal WRS (step S2: N).

Now a case where the nonvolatile memory system 1 is set in writing mode will be described. In step S3, the third selector 53 and the fourth selector 54 select the writing circuit 41 as the circuit to be connected in accordance with high-level switching signal WRS. Then in step S4, it is determined whether it is initial data writing operation or additional data writing operation. This decision is made by the comparator 32 by comparing the column address YAdd and the division address DAdd. As shown in FIG. 2, the comparator 32 compares the column address YAdd and the division address DAdd, and forwards the comparison signal COS indicating the result of comparison to the control circuit 22. When the column address YAdd is lower than the division address DAdd, the control circuit 22 decides that the destination of writing is the first region SP1 and that this is initial data writing operation, and outputs low-level selector switching signal SCS (step S4: Y). When the column address YAdd is higher than the division address DAdd, the control circuit 22 decides that the destination of writing is the second region SP2 and that this is additional data writing operation, and outputs high-level selector switching signal SCS (step S4: N).

Now the initial data writing operation will be described. In step S5, the second selector 52 selects the first region SP1 as the destination of writing the data for spare memory SDW in accordance with the low-level selector switching signal SCS, and the first selector 51 selects the reference cell for main memory 12 as the destination of writing the reference data RDW.

Then in step S6, the writing circuit 41 selects whether the output data is the data for main memory MDW or the data for spare memory SDW. This selection is done in accordance with a flag signal provided at the column address YAdd. In this embodiment, the address A11 which the most significant bit of the column address YAdd is used as the flag signal. When the address A11 is at low level (step S6: Y), the writing circuit 41 outputs the data for main memory MDW (step S7), which is input to the main memory cell array 10 via the Y selector 26. When the address A11 is at high level (step S6: N), the writing circuit 41 outputs the data for spare memory SDW (step S8), which is input to the first region SP1 via the fourth selector 54 and the second selector 52.

Then in step S9, data is written in the main memory cell array 10 and/or in the first region SP1. Data is written in the following procedure. The row address XAdd from the address buffer 23 is an input to the X decoder 24, and the column address YAdd is input to the Y decoder 25. The row address XAdd is decoded by the X decoder 24 so as to select the desired word line, and the column address YAdd is decoded by the Y decoder 25 so as to select the desired bit line, thereby determining the memory cell to write the data in. Then a write voltage is applied to the bit line of the selected memory cell, to start writing of the data.

After writing, the operation proceeds to step S10. If the initial data writing operation is not complete, the operation returns to step S4 and writing continues. If the initial data writing operation has been completed, the operation proceeds to step S11, where the reference data RDW is written. The reference data RDW is input to the first selector 51 via the third selector 53. The first selector 51 has selected the reference cell for main memory 12 as the destination of writing the data, as described previously. Therefore, writing the reference data RDW in the reference cell for main memory 12 completes the initial data writing operation, and the operation returns to step S2.

In the initial data writing operation, as described above, writing of the data for main memory MDW in the main memory cell array 10 and writing of the data for spare memory SDW in the first region SP1 are carried out at the same time. Also during this writing operation, the reference data RDW is written in the reference cell for main memory 12 at the same time or session. Thus in the initial data writing operation, the main memory cell array 10, the first region SP1 and the reference cell for main memory 12 are selected and data is written therein, as indicated by region R1 in FIG. 4. As a result, the main memory cell array 10 shows an appearance of having been increased by the amount of the first region SP1.

Now the additional data writing operation will be described. In step S12, the column address YAdd is set higher than the division address DAdd, and the control circuit 22 outputs high-level selector switching signal SCS (step S4: N). The second selector 52 selects the second region SP2 as the destination of writing the data for spare memory SDW in accordance with the high-level selector switching signal SCS, and first selector 51 selects the reference cell for spare memory 13 as the destination of writing the reference data RDW. In step S13, data is written in the second region SP2 and in the reference cell for spare memory 13. In the additional data writing operation, as indicated by region R2 in FIG. 5, the second region SP2 and the reference cell for spare memory 13 are selected and data is written therein.

Reading operation will now be described. In step S20, the third selector 53 and the fourth selector 54 select the spare memory sense amplifier 44 as the destination of connection in accordance with low-level switching signal WRS. Then in step S21, it is decided whether data is to be read from the first region SP1 to which the initial data writing operation was done, or from the second region SP2 to which the additional data writing operation was done. This decision is made by the comparator 32 by comparing the column address YAdd and the division address DAdd.

When the comparison signal COS indicating that the column address YAdd is lower than the division address DAdd is input, the control circuit 22 decides that data is to be read from the first region SP1 and outputs low-level selector switching signal SCS (step S21: Y). In step S22, in accordance with the low-level selector switching signal SCS, the second selector 52 selects the first region SP1 and the first selector 51 selects the reference cell for main memory 12. As a result, the first memory cell current IS1 which is output from the first region SP1 is input to the spare memory sense amplifier 44 via the second selector 52. Also the reference cell current for main memory IMR which is output from the reference cell for main memory 12 is input to the spare memory sense amplifier 44 via the first selector 51. The spare memory sense amplifier 44 compares the first memory cell current IS1 and the reference cell current for main memory IMR, so as to execute the data reading operation (step S23).

On the other hand, when the comparison signal COS indicating that the column address YAdd is higher than the division address DAdd is input, the control circuit 22 decides that data is to be read from the second region SP2 and outputs high-level selector switching signal SCS (step S21: N). In step 25, in accordance with the high-level selector switching signal SCS, the second selector 52 selects the second region SP2 and the first selector 51 selects the reference cell for spare memory 13 (step S25). As a result, the second memory cell current IS2 which is output from the second region SP2 and the reference cell current for spare memory ISR which is output from the reference cell for spare memory 13 are input to the spare memory sense amplifier 44. The spare memory sense amplifier 44 compares the second memory cell current IS2 and the reference cell current for spare memory ISR, so as to execute the data reading operation (step S23).

The operation of reading data from the main memory cell array 10 is carried out by the main memory sense amplifier 43 by comparing the main memory cell current IM and the reference cell current for main memory IMR. When the address A11 is at low level, the sense amplifier 42 outputs the data which has been read from the main memory cell array 10 as the read data DR, while when the address A11 is at high level, the sense amplifier 42 outputs the data which has been read from the spare memory cell array 11 as the read data DR. After reading, the operation proceeds to step S24. If there remains data to be read, the operation returns to step S21 and reading continues. If reading has been completed, the operation proceeds to step S2.

As will be apparent from the above description, the nonvolatile memory system 1 of this embodiment makes use of such a relationship based on the timing of writing operation as the reference cell for the main memory 12 is associated with the initial data writing operation and the reference cell for the spare memory 13 is associated with the additional data writing operation. As a result, after data has been written in the first region SP1 of the spare memory cell array 11 and in the reference cell for main memory 12 during the initial data writing operation, the reference cell for spare memory 13 can be used as the reference cell for writing the reference data as additional data is written in the second region SP2 of the spare memory cell array 11 during the additional data writing operation. Therefore, after the initial data writing operation to the first region SP1 of the spare memory cell array 11, additional data writing operation can be made to the second region SP2 of the spare memory cell array 11. Thus one-time additional data writing operation to the spare memory cell array 11 is made possible.

In order to achieve the additional data writing operation of the spare memory cell array 11, the nonvolatile memory system 1 of this embodiment may merely require the address register 31, the comparator 32 and the first selector 51 through the fourth selector 54, without need for a refresh circuit or the like of a large circuit size. As a result, it is made possible to write to the spare memory cell array 11 once more without need for a significant change in the circuit design, thus keeping the circuit size from growing.

The present invention is not limited to the embodiments described above, and it is understood that various improvements and modifications can be made without departing from the spirit and scope of the present invention. Although the column address YAdd is used as the flag signal in this embodiment, the present invention is not limited to this. Any address signal which is not used as the column address YAdd may be used as the flag signal. For example, an address signal which is not used as the column address because of the employment of burst operation may be used as the flag signal.

Figure 6:
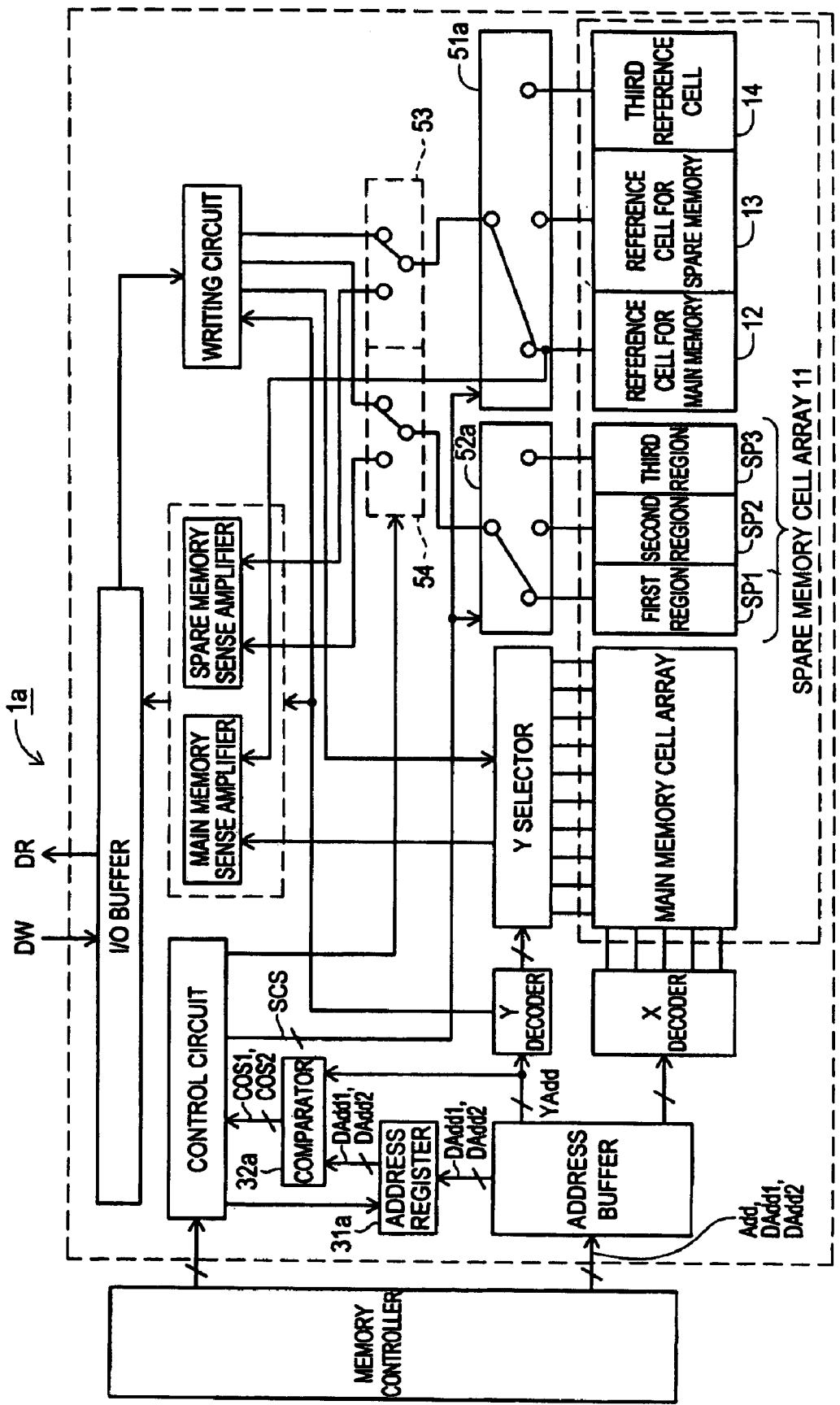
FIG. 6 is a schematic diagram of an exemplary system diagram which enables multiple programming of spare memory region in a non-volatile memory, according to one embodiment.

Moreover, the number of additional writing operations made to the spare memory cell array 11 is not restrictive. As in the case of nonvolatile memory system 1a shown in FIG. 6, the number of additional writing operations which can be made to the spare memory cell array 11 may be two or more. The address register 31a stores DAdd1 and DAdd2 as the division address. Accordingly, the spare memory cell array 11 is divided into three parts of the first region SP1 through the third region SP3. And a third reference cell 14 is provided in correspondence to the third region SP3.

The comparator 32a outputs a comparison signal COS1 indicating the result of comparing the column address YAdd and the division address DAdd1 and a comparison signal COS2 indicating the result of comparing the column address YAdd and the division address DAdd2. The first selector 51a selects the cell to which the third selector 53 is to be connected among the reference cell for main memory 12, the reference cell for spare memory 13, and the third reference cell 14, in accordance with the selector switching signal SCS. Similarly, the second selector 52a selects the region to which the fourth selector 54 is to be connected among the first region SP1 through the third region SP3, in accordance with the selector switching signal SCS.

Since the embodiment described above enables the system 1a to associate the reference cell for main memory 12 to the initial data writing operation, the reference cell for spare memory 13 to the first additional data writing operation, and the third reference cell 14 to the second additional data writing operation, two more data writing operations can be performed to the spare memory cell array 11. It is appreciated that three or more additional data writing operations can be performed in a similar way.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A nonvolatile memory device, comprising:
   a main memory cell array;
   a spare memory cell array divided into a first region and a second region;
   a first reference cell associated with the main memory and the first region of the spare memory cell;
   a second reference cell associated with the second region of the spare memory cell; and
   a selection module for selecting the main memory cell array and the first region to write data and the first reference cell to write first reference data associated with the data during an initial data writing operation and for selecting the second region to write additional data and the second reference cell to write second reference data associated with the additional data during an additional data writing operation.

2. The nonvolatile memory device according to claim 1, wherein the selection module selects the first reference cell when reading the data from the main memory cell array and from the first region, and selects the second reference cell when reading the additional data from the second region.

3. The nonvolatile memory device according to claim 2, wherein the selection module comprises a comparator circuit which compares a division address that divides the first region and the second region with an address signal to determine which of the first region and the second region is a destination associated with the address signal.

4. The nonvolatile memory device according to claim 3, wherein the selection module comprises a first selector for selecting the first reference cell when the destination is the first region, and for selecting the second reference cell when the destination is the second region.

5. The nonvolatile memory device according to claim 3, wherein the selection module comprises a second selector which switches between the first region and the second region based on a comparison by the comparator circuit.

6. The nonvolatile memory device according to claim 3, wherein the selection module comprises an address register which holds the division address and forwards the division address to the comparator circuit.

7. The nonvolatile memory device according to claim 4, wherein the selection module comprises a third selector which is used to forward the first reference data and the second reference data to the first selector during the initial writing operation and the additional writing operation, respectively, and is used to forward the reference data from the first selector to a sense amplifier during the reading of the data or the additional data.

8. The nonvolatile memory device according to claim 3, wherein the selection module comprises a fourth selector which is used to forward the data and the additional data for the spare memory to the second selector during the initial writing operation and the additional writing operation, respectively, and is used to forward the data and the additional data for the spare memory from the second selector to a sense amplifier during the reading of the data and the additional data, respectively.

9. The nonvolatile memory device according to claim 3, wherein the address signal comprises a flag signal which indicates which of the main memory cell array and the spare memory cell array is a destination being accessed.

10. The nonvolatile memory device according to claim 9, further comprising a writing circuit which generates:
main memory cell array data when the main memory cell array is the destination; and
spare memory cell array data when the spare memory cell array is the destination.

11. The nonvolatile memory device according to claim 9, comprising a sense amplifier which forwards:
the main memory cell array data if the data is to be read from the main memory cell array; and
the spare memory cell array data when the data is to be read from the spare memory cell array.

12. The nonvolatile memory device according to claim 9, wherein the flag signal is the most significant bit of a column address of the address signal.

13. The nonvolatile memory device according to claim 1, wherein the nonvolatile memory device is a flash memory with a NAND interface.

14. A method for controlling a nonvolatile memory device having a first reference cell associated with a main memory cell array and a second reference cell associated to a spare memory cell array, comprising:
dividing the spare memory cell array into at least a first region and a second region;
selecting the main memory cell array and the first region as a destination for writing data and selecting the first reference cell as a destination for writing first reference data during an initial data writing operation; and
selecting the second region as a destination for writing additional data and selecting the second reference cell as a destination for writing second reference data during an additional data writing operation.

15. The method for controlling the nonvolatile memory device according to claim 14, comprising:
selecting the first reference cell when reading the data from the main memory cell array and the first region; and
selecting the second reference cell when reading the additional data from the second region.

16. A nonvolatile memory system, comprising:
a main memory cell array;
a spare memory cell array;
a memory controller that divides the spare memory cell array into at least a first region and a second region; and
a selection module for selecting the main memory cell array and the first region to write data and the first reference cell to write first reference data associated with the data during an initial data writing operation and for selecting the second region to write additional data and the second reference cell to write second reference data associated with the additional data during an additional data writing operation.

17. The nonvolatile memory system according to claim 16, wherein the selection module selects the first reference cell when reading the data from the main memory cell array and from the first region, and selects the second reference cell when reading the additional data from the second region.

18. The nonvolatile memory system according to claim 17, wherein the selection module comprises a comparator circuit which compares a division address that divides the first region and the second region with an address signal to determine which of the first region and the second region is a destination associated with the address signal.

19. The nonvolatile memory system according to claim 18, wherein the selection module comprises a first selector for selecting the first reference cell when the destination is the first region, and for selecting the second reference cell when the destination is the second region, and a second selector which switches between the first region and the second region based on a result of comparison by the comparator circuit.

20. The nonvolatile memory device according to claim 18, wherein the selection module comprises a third selector which is used to forward the first reference data and the second reference data to the first selector during the initial writing operation and the additional writing operation, respectively, and is used to forward the reference data from the first selector to a sense amplifier during the reading of the data or the additional data, and a fourth selector which is used to forward the data and the additional data for the spare memory to the second selector during the initial writing operation and the additional writing operation, respectively, and is used to forward the data and the additional data for the spare memory from the second selector to a sense amplifier during the reading of the data and the additional data, respectively.

* * * * *